United States Patent
Moschiano et al.

(10) Patent No.: US 8,879,329 B2
(45) Date of Patent: Nov. 4, 2014

(54) PROGRAM VERIFY OPERATION IN A MEMORY DEVICE

(75) Inventors: Violante Moschiano, Bacoli (IT); Giovanni Santin, Rieti (IT); Michele Incarnati, Gioia dei Marsi (IT)

(73) Assignee: Micron Technology, Inc., Boise, ID (US)

(*) Notice: Subject to any disclaimer, the term of this patent is extended or adjusted under 35 U.S.C. 154(b) by 273 days.

(21) Appl. No.: 12/949,876

(22) Filed: Nov. 19, 2010

(65) Prior Publication Data

US 2012/0127794 A1    May 24, 2012

(51) Int. Cl.
G11C 11/34 (2006.01)
G11C 16/06 (2006.01)
G11C 16/34 (2006.01)
G11C 11/56 (2006.01)

(52) U.S. Cl.
CPC ........ *G11C 16/3459* (2013.01); *G11C 11/5628* (2013.01)
USPC ..................... 365/185.22; 365/236

(58) Field of Classification Search
USPC ........................ 365/185.01–185.33
See application file for complete search history.

(56) References Cited

U.S. PATENT DOCUMENTS

| | | | |
|---|---|---|---|
| 5,638,320 A | 6/1997 | Wong et al. | |
| 6,038,166 A * | 3/2000 | Wong .................. | 365/185.03 |
| 6,366,496 B1 | 4/2002 | Torelli et al. | |
| 7,196,927 B2 * | 3/2007 | Tran et al. ............ | 365/185.05 |
| 7,417,900 B2 * | 8/2008 | Rolandi et al. ....... | 365/185.25 |
| 7,450,427 B2 | 11/2008 | Yamada | |
| 7,558,120 B2 * | 7/2009 | Takai .................... | 365/185.22 |
| 7,800,951 B2 * | 9/2010 | Sutardja ............... | 365/185.19 |
| 7,864,589 B2 * | 1/2011 | Sarin et al. ........... | 365/185.21 |
| 8,023,334 B2 * | 9/2011 | Hoei et al. ............ | 365/185.24 |
| 8,243,523 B2 * | 8/2012 | Pabustan et al. ..... | 365/185.19 |
| 8,254,180 B2 * | 8/2012 | Hoei et al. ............ | 365/185.24 |
| 2009/0021987 A1 | 1/2009 | Sarin et al. | |
| 2010/0039863 A1 * | 2/2010 | Sarin et al. ........... | 365/185.19 |
| 2011/0051514 A1 * | 3/2011 | Han et al. ............. | 365/185.09 |
| 2011/0242900 A1 * | 10/2011 | Hoei ..................... | 365/185.19 |
| 2012/0176846 A1 * | 7/2012 | Sutardja ............... | 365/189.05 |

* cited by examiner

*Primary Examiner* — Kretelia Graham
(74) *Attorney, Agent, or Firm* — Dicke, Billig & Czaja, PLLC

(57) ABSTRACT

Methods for program verifying, program verify circuits, and memory devices are disclosed. One such method for program verifying includes generating a ramped voltage for a plurality of count values. The ramped voltage is applied to a control gate of a memory cell being program verified. At least a portion of each count value is compared to an indication of a target threshold voltage for the memory cell. When the at least a portion of the count value is equal to the indication of the target threshold voltage indication, sense circuitry is used to check if the memory cell has been activated by the voltage generated by the count. If the memory cell has been activated, an inhibit latch is set to inhibit further programming of the memory cell. If the memory cell has not been activated by the voltage, the memory cell is biased with another programming pulse.

26 Claims, 4 Drawing Sheets

PROGRAM VERIFY OPERATION IN A MEMORY DEVICE

TECHNICAL FIELD

The present embodiments relate generally to memory and a particular embodiment relates to program verify of a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type is determined by the presence or absence of the charge in the charge storage structure.

A programming operation typically comprises a series of incrementally increasing programming pulses that are applied to a control gate of a memory cell being programmed. A program verify operation after each programming pulse determines the threshold voltage of the memory cell resulting from the preceding programming pulse.

A typical program verify operation includes storing a target threshold voltage in a page buffer that is coupled to each data line (e.g., bit line) and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare if the present threshold voltage is greater than or equal to the stored target threshold voltage. If the present threshold voltage is greater than or equal to the target threshold voltage, further programming is inhibited.

Performing a "greater than" comparison in the page buffer uses additional circuitry. For example, each page buffer might use two additional transistors just to perform the "greater than" comparison. Since each bit line is coupled to a different page buffer and a typical NAND flash memory device can have hundreds of thousands of bit lines, the additional circuitry just to perform the "greater than" comparison can add up to be millions of transistors. Such a large number of transistors take up valuable real estate on the integrated circuit die that can be used for additional memory cells.

For the reasons stated above, and for other reasons that will become apparent to those skilled in the art upon reading and understanding the present specification, there is a need in the art for reducing the size of comparison circuitry in a memory device.

DETAILED DESCRIPTION

Figure 1:
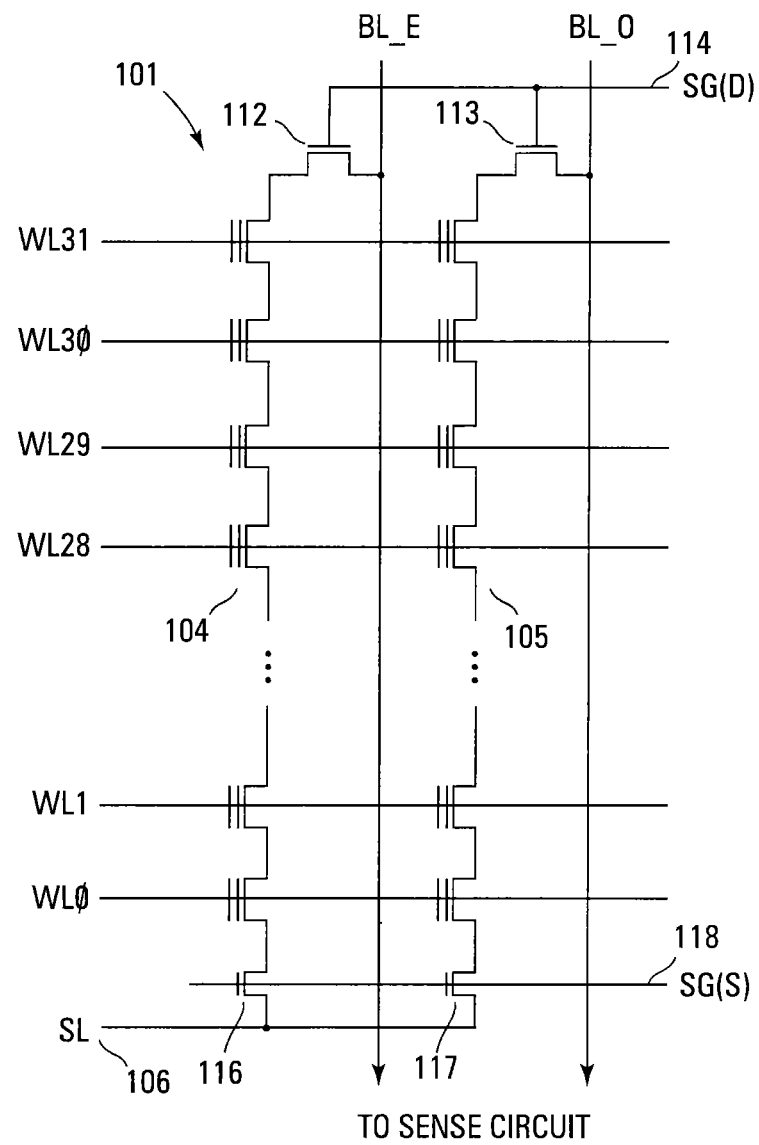
FIG. 1 shows a schematic diagram of a portion of one embodiment of a NAND memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101 comprising series strings of non-volatile memory cells. The schematic diagram of FIG. 1 is for purposes of illustration only as the memory array architecture is not limited to the illustrated NAND architecture. Alternate embodiments can use NOR or other architectures as well.

The memory array 101 comprises an array of non-volatile memory cells (e.g., floating gate) arranged in columns such as series strings 104, 105. Each of the cells is coupled drain to source in each series string 104, 105. An access line (e.g. word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually each bit line is coupled to a page buffer with sense circuitry that detects the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or a multiple level cell (MLC). Each cell's threshold voltage ($V_t$) is indicative of the data that is stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

During a program verify operation, a word line digital-to-analog converter (DAC) generates a ramped voltage, from a digital count, that is applied via a word line to the control gate of each selected memory cell. When the ramped voltage reaches the voltage to which the selected memory cell is programmed (e.g., $V_t$), the selected memory cell conducts and generates a current on the bit line to which it is coupled. The digital count that generated the particular voltage that activated the selected memory cell can then be used as being indicative of the particular voltage.

Figure 2:
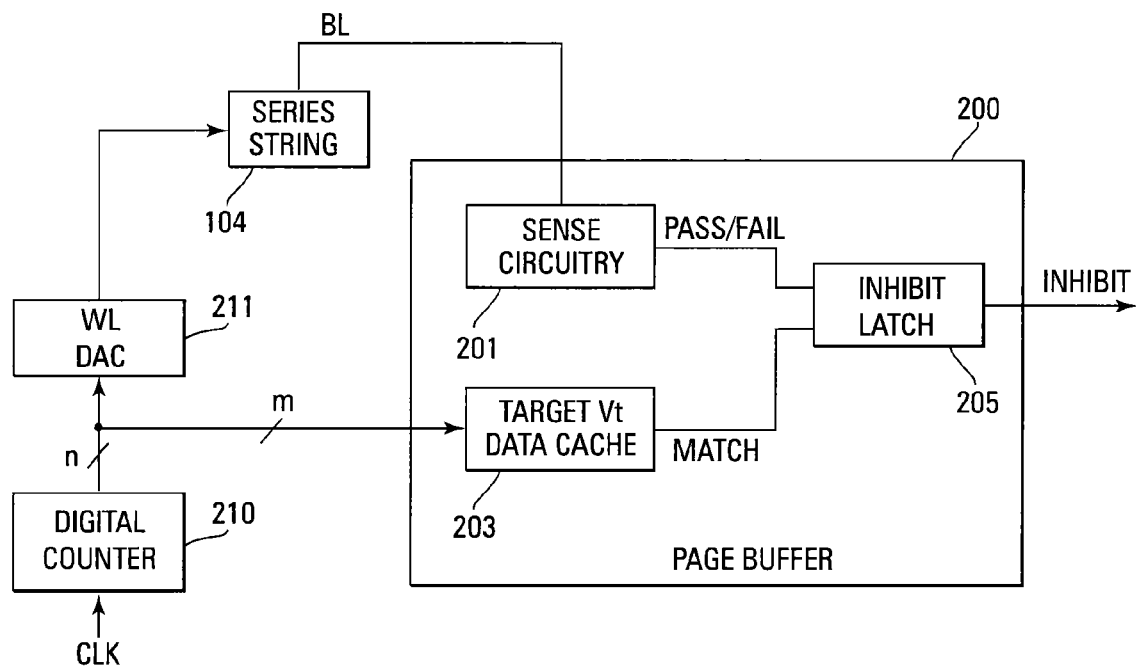
FIG. 2 shows a block diagram of one embodiment of a program verify circuit.

FIG. 2 illustrates a block diagram of one embodiment of a page buffer 200 that is coupled to one of the bit lines of FIG. 1. Each bit line of a memory array can be coupled to a different page buffer. In one embodiment, each page buffer is substantially similar to the block diagram of FIG. 2.

FIG. 2 also illustrates an example of a digital counter 210 and digital-to-analog converter (DAC) 211. The digital counter 210 is an n-bit digital counter that inputs an incrementing digital count signal to the DAC 211. The DAC 211 uses the digital count to generate the ramped voltage.

The page buffer 200 includes sense circuitry (e.g., sense amplifier) 201 that is coupled to the bit line. The sense circuitry 201 is responsible for detecting a current on the bit line when a selected memory cell that is coupled to the bit line is activated. The sense circuitry 201 is configured to output a pass/fail signal in response to the detected current. The pass signal (e.g., a positive pulse) indicates that a current was detected. The fail signal (e.g., no pulse) indicates that a current has not been detected.

The page buffer 200 further includes match circuitry, such as a target threshold voltage data cache 203 that is coupled to the n-bit digital counter 210. The target threshold voltage data cache 203 is configured to store an indication of a desired target $V_t$ at the start of a programming operation. In one embodiment, the indication of the target $V_t$ is stored as a digital representation of the threshold voltage. The digital representation of the threshold voltage, in one embodiment, is the digital count that generates the particular voltage, of a ramped voltage, that activates the selected memory cell. In an alternate embodiment, the indication of the target $V_t$ may be stored as an analog voltage.

The digital count from the digital counter 210, in the illustrated embodiment, is an m-bit digital word. In one embodiment, m<n. In such an embodiment, the indication of the target Vt should also be an m-bit digital word. In an alternate embodiment, m can equal n.

The output of the target threshold voltage data cache 203 is a match signal (e.g., positive pulse) that indicates when the digital count (or, in the case of m<n, when at least a portion of the digital count) from the n-bit counter 210 matches the target $V_t$ stored at the start of the programming operation. The target threshold voltage data cache 203 performs a comparison when a digital count (or at least a portion of the digital count, such as when m<n) is input to the target threshold data cache 203 and outputs the match signal when the two digital values match.

The page buffer 200 further includes an inhibit latch 205 that is coupled to both the sense circuitry 201 and the target threshold voltage data cache 203. The inhibit latch 205 is set when both the MATCH signal and the PASS/FAIL signal are true. In other words, the inhibit latch is set when the PASS/FAIL signal indicates that current has been detected on the bit line and the MATCH signal indicates that the stored $V_t$ is equal to the digital count input to the page buffer 200. The INHIBIT signal is an indication that the selected memory cell is programmed to the target threshold voltage.

The INHIBIT signal indicates to the memory control circuitry to inhibit further programming of the selected memory cell. In one embodiment, the memory control circuitry controls biasing of the bit lines during programming of the memory cells. A bit line that is biased at 0V enables memory cells coupled to that particular bit line to be programmed by the proper word line programming voltage. Increasing the bit line voltage slows the programming of the memory cells coupled to that particular bit line. The memory control circuitry can control generation of an inhibit voltage (e.g., $V_{CC}$) to bias the selected bit line when the INHIBIT signal is true.

Figure 3:
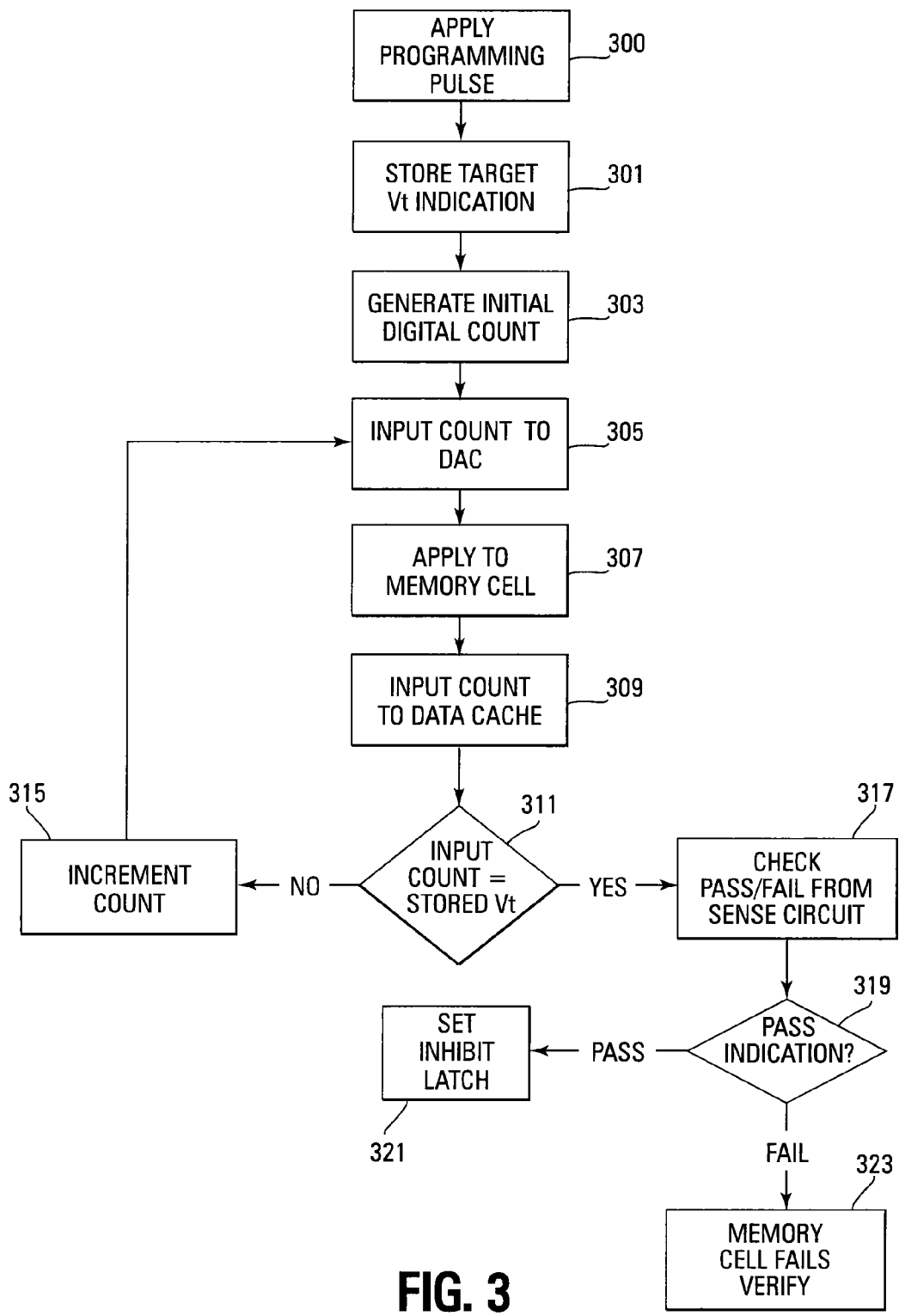
FIG. 3 shows a flowchart of one embodiment of a program verify operation in accordance with the program verify circuit of FIG. 2.

A flowchart of one embodiment of a program verify operation, in accordance with FIG. 2, is illustrated in FIG. 3. Reference can be made to FIG. 2 for operation of the various components of the block diagram.

A programming pulse is applied to the control gate of the selected memory cell 300 via a selected word line. The programming pulse can increase the threshold voltage of the memory cell being programmed. An indication of a target $V_t$ (e.g., digital data) is stored in the target threshold voltage data cache 301 prior to attempting to verify the memory cell. An initial digital count is generated 303 and input to the DAC 305 to begin generation of the ramped voltage that is applied 307, via a word line, to a control gate of each selected memory cell coupled to the selected word line. The digital count or a particular number of bits of the digital count is input to the target threshold voltage data cache 309. Each digital count of the count signal that is input to the target threshold voltage data cache is compared to the stored target $V_t$ 311.

If the digital count is not equal to the stored target $V_t$ 311 the counter is incremented 315 and the incremented count is input to the DAC 305. The ramped voltage continues to be generated and the count compared to the target $V_t$ until the input count is equal to the stored target $V_t$ 311. The sense circuitry is then checked for the PASS/FAIL signal 317.

If the PASS/FAIL signal indicates a PASS condition 319, the inhibit latch is set 321 to indicate that the threshold voltage of the memory cell has reached the stored target $V_t$. Further programming of the selected memory cell can now be inhibited.

If the PASS/FAIL signal indicates a FAIL condition 319, the verify operation that particular memory cell has failed 323. Even though the DAC counter and DAC will continue to generate a ramped voltage for other memory cells being verified on the same word line, the particular memory cell that failed can receive another programming pulse and the program verify operation repeated.

Figure 4:
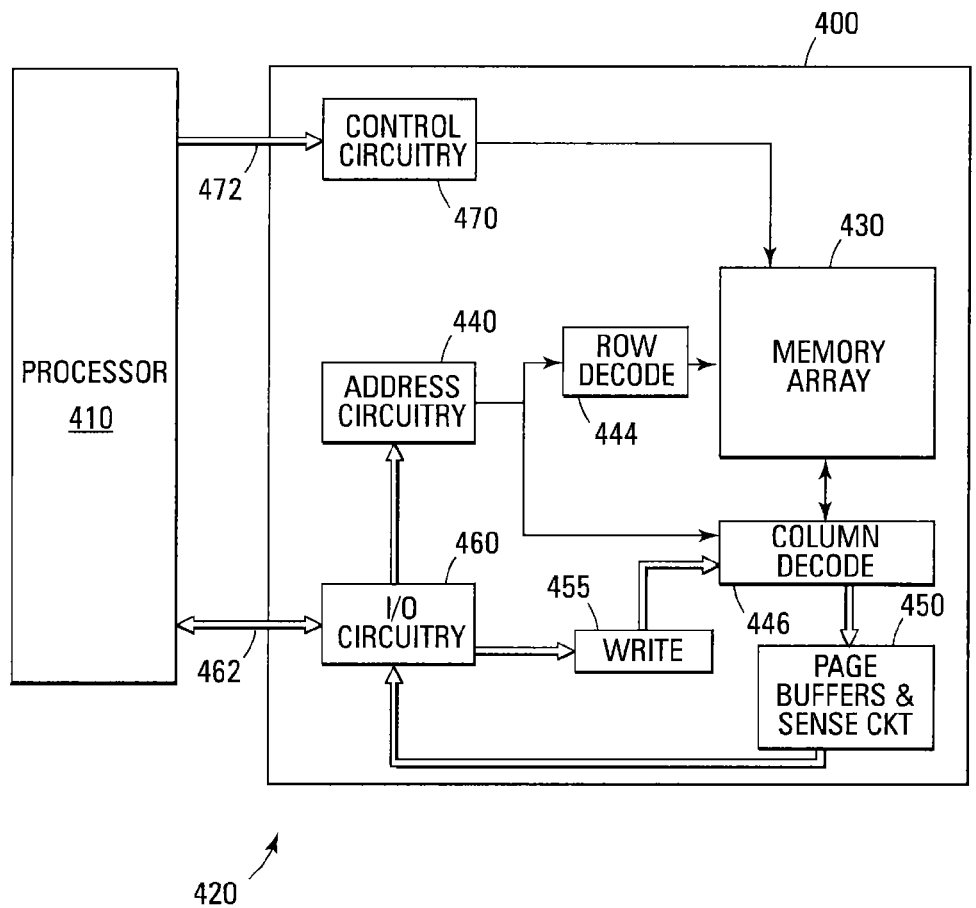
FIG. 4 shows a block diagram of one embodiment of a memory system that can incorporate the program verify circuit of FIG. 2.

FIG. 4 illustrates a functional block diagram of a memory device 400. The memory device 400 is coupled to an external processor 410. The processor 410 may be a microprocessor or some other type of controller. The memory device 400 and the processor 410 form part of a memory system 420.

The memory device 400 includes an array 430 of memory cells (e.g., non-volatile memory cells). The memory array 430 is arranged in banks of word line rows and bit line columns. In one embodiment, the columns of the memory array 430 comprise series strings of memory cells.

Address buffer circuitry 440 is provided to latch address signals provided through I/O circuitry 460. Address signals are received and decoded by a row decoder 444 and a column decoder 446 to access the memory array 430.

The memory device 400 reads data in the memory array 430 by sensing voltage or current changes in the memory array columns using sense amplifier circuitry 450. The page buffers 450, in one embodiment, are coupled to read and latch a row of data from the memory array 430. The page buffers 450, as previously described, include the sense circuitry as well as other circuits for performing a program verify operation. Data input and output buffer circuitry 460 is included for bidirectional data communication as well as the address communication over a plurality of data connections 462 with the processor 410. Write circuitry 455 is provided to write data to the memory array.

Memory control circuitry 470 decodes signals provided on control connections 472 from the processor 410. These signals are used to control the operations on the memory array 430, including data read, data write (program), and erase operations. The memory control circuitry 470 may be a state machine, a sequencer, or some other type of controller to generate the memory control signals. In one embodiment, the memory control circuitry 470 is configured to control execution of the program verify embodiments of the present disclosure.

The memory device illustrated in FIG. 4 has been simplified to facilitate a basic understanding of the features of the memory. A more detailed understanding of internal circuitry and functions of flash memories are known to those skilled in the art.

Conclusion

In summary, one or more embodiments of the program verify operation and program verify circuit can provide a program verify function of a memory cell using a reduced quantity of components as compared to the prior art. The circuit typically used for the "greater than" function in the page buffer can be eliminated by comparing at least a portion of a count, used to generate a ramped word line voltage, with a stored target $V_t$. When the at least a portion of the count and target $V_t$ are equal, a sense circuitry is then checked to determine if the memory cell has been activated by the voltage generated by the count. If the memory cell is activated, further programming of the memory cell can be inhibited. Otherwise, the memory cell continues with the programming operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for program verifying a memory cell, the method comprising:
   generating a voltage responsive to a count;
   applying the voltage to a control gate of the memory cell;
   determining whether at least a portion of the count is equal to an indication of a target threshold voltage for the memory cell;
   after determining that at least a portion of the count is equal to the indication of the target threshold voltage for the memory cell, determining whether the memory cell is activated by the voltage generated responsive to the count; and
   inhibiting programming of the memory cell responsive to the at least a portion of the count being equal to the indication of the target threshold voltage and the memory cell being activated by the voltage.

2. The method of claim 1 and further comprising applying a programming pulse to the control gate of the memory cell responsive to the at least a portion of the count being not equal to the indication of the target threshold voltage and the voltage not activating the memory cell.

3. The method of claim 1 wherein a plurality of counts are input to a digital-to-analog converter to generate a ramped voltage.

4. The method of claim 1 wherein the indication of the target threshold voltage is a digital indication.

5. The method of claim 1 wherein the count is generated by an n-bit digital counter and the at least a portion of the count is an m-bit digital word.

6. The method of claim 5 wherein n=m.

7. A method for program verifying a memory cell, the method comprising:
   storing an indication of a target threshold voltage;
   generating a ramped voltage from a plurality of counts, each count associated with a particular voltage;
   applying the ramped voltage to a control gate of the memory cell;
   comparing at least a portion of each count of the plurality of counts to the indication of the stored target threshold voltage;
   responsive to the at least the portion of each count and the indication of the stored target threshold voltage being equal, determining if the memory cell has been activated by the particular voltage of the ramped voltage that is associated with a particular count; and
   inhibiting programming of the memory cell responsive to both the at least the portion of the particular count being equal to the indication of the stored target threshold voltage and the memory cell being activated.

8. The method of claim 7 wherein storing the indication of the target threshold voltage comprises storing the indication in a data cache of a page buffer.

9. The method of claim 8 wherein the ramped voltage is applied to an access line coupled to the control gate.

10. The method of claim 7 wherein inhibiting programming comprises controlling an inhibit voltage to a data line coupled to the memory cell to inhibit programming of the memory cell.

11. The method of claim 7 wherein each count is incremented from a previous count.

12. A program verify circuit comprising:
   a buffer coupled to a data line of an array of memory cells, the buffer comprising:
      match circuitry configured to store an indication of a target threshold voltage of a memory cell coupled to the data line and generate a match signal responsive to a comparison of at least a portion of a count and the stored indication of the target threshold voltage;
      sense circuitry configured to generate a pass/fail signal responsive to detection of a current on the data line indicating that the memory cell is activated by the voltage generated responsive to the count, and whose pass/fail signal for a given program verify operation is not checked until the at least a portion of the count is equal to the indication of the target threshold voltage for the memory cell; and
      an inhibit latch coupled to the match circuitry and the sense circuitry and configured to generate an inhibit signal responsive to a pass signal of the pass/fail signal and the match signal wherein the inhibit signal indicates that the memory cell is programmed to the target threshold voltage after determining that the at least a portion of the count is equal to the indication of the target threshold voltage for the memory cell.

13. The program verify circuit of claim 12 and further including a digital counter coupled to provide the at least a portion of the count to an input of the match circuitry and to provide the count to an input of a digital-to-analog converter wherein the digital counter is configured to generate the count.

14. The program verify circuit of claim 13 wherein the digital counter is an n-bit counter and the at least a portion of the count input to the match circuitry is an m-bit count and the count input to the digital-to-analog converter is an n-bit count wherein m<n.

15. The program verify circuit of claim 13 wherein the digital-to-analog converter is configured to generate a ramped voltage from a plurality of counts wherein the ramped voltage is coupled to an access line coupled to the array of memory cells.

16. The program verify circuit of claim 12 wherein the indication of the target threshold voltage is a digital representation of the target threshold voltage.

17. The program verify circuit of claim 12 wherein the match circuitry comprises a data cache.

18. A memory device comprising:
   an array of memory cells organized in a plurality of series strings of memory cells, each series string coupled to a data line;
   a buffer coupled to each data line, the buffer comprising:
      match circuitry configured to store an indication of a target threshold voltage of a memory cell and generate a match signal responsive to a comparison of at least a portion of a count and the stored indication of the target threshold voltage;
      sense circuitry configured to generate a pass/fail signal responsive to a detection of a current on a data line indicating that the memory cell is activated by the voltage generated responsive to the count; and
      an inhibit latch coupled to the match circuitry and the sense circuitry and configured to be set by the match signal and a pass signal of the pass/fail signal after determining that the at least a portion of the count is equal to the stored indication of the target threshold voltage for the memory cell; and
   memory control circuitry coupled to the array of memory cells and configured to control operation of the array of memory cells wherein the memory control circuitry is further configured to inhibit programming of the memory cell responsive to the inhibit latch being set, and wherein the memory control circuitry is further configured to not check for the pass/fail signal of the sense circuitry until the at least a portion of the count is equal to the indication of the target threshold voltage for the memory cell.

19. The memory device of claim 18 wherein the memory control circuitry is configured to control biasing of the data line to inhibit programming of the memory cell.

20. The memory device of claim 18 wherein the memory control circuitry is configured to control biasing of the data line responsive to the inhibit latch.

21. The memory device of claim 18 wherein the match signal is a positive voltage pulse.

22. The memory device of claim 18 and further including a counter coupled to a digital-to-analog converter wherein the counter is configured to count when both the match signal and the pass/fail signal indicate that the memory cell fails a program verify operation.

23. The memory device of claim 22 wherein the memory control circuitry is further configured to control generating a programming pulse that is applied to the memory cell when the memory cell fails the program verify operation.

24. The memory device of claim 18 wherein the sense circuitry is configured to generate the pass signal when a current is detected on the data line.

25. The method of claim 1, wherein inhibiting programming comprises setting an inhibit latch responsive to the count being equal to the indication of the target threshold voltage and the memory cell being activated by the voltage.

26. The method of claim 7, wherein inhibiting programming comprises setting an inhibit latch responsive to the particular count being equal to the indication of the target threshold voltage and the memory cell being activated by the particular voltage.

* * * * *